(12) United States Patent
Bates

(10) Patent No.: US 6,265,893 B1
(45) Date of Patent: Jul. 24, 2001

(54) SIGNAL LINE DRIVERS

(75) Inventor: Sarah E. Bates, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/162,801

(22) Filed: Sep. 29, 1998

(51) Int. Cl.[7] .......................... H03K 17/16; H03K 19/003
(52) U.S. Cl. ............................. 326/30; 326/86; 326/27
(58) Field of Search .................................. 326/30, 83, 86, 326/80, 27, 81

(56) References Cited

U.S. PATENT DOCUMENTS

| | | | |
|---|---|---|---|
| 4,760,292 | * | 7/1988 | Bach ........................................ 326/86 |
| 4,859,877 | * | 8/1989 | Cooperman et al. .................... 326/30 |
| 5,821,767 | * | 10/1998 | Osaka et al. ............................. 326/30 |
| 6,060,905 | * | 5/2000 | Bickford et al. ......................... 326/81 |

OTHER PUBLICATIONS

Thomas F. Knight, Jr., et al., *A Self–Terminating Low–Voltage Swing CMOS Output Driver*, IEEE Journal of Solid--State Circuits (Apr. 1988), vol. 23, No. 2, pp. 457–464.

Howard Johnson et al., *High Speed Digital Design*, Prentice–Hall, Inc. (1993), pp. 231–232.

* cited by examiner

*Primary Examiner*—Michael Tokar
*Assistant Examiner*—Daniel D. Chang
(74) *Attorney, Agent, or Firm*—Trop, Pruner & Hu, P.C.

(57) ABSTRACT

Signal driving circuitry includes first and second drivers that are coupled to different points on a transmission line having an impedance. The first driver includes a transistor and a resistance that matches the transmission line impedance. The transistor is active to drive the transmission line to a specified voltage when the first and second drivers are inactive. In one configuration, the first and second drivers include CMOS drivers. In another configuration, the first driver includes a CMOS driver while the second driver includes a GTL-type driver. Termination devices in the first and second drivers may be alternately switched in and out of the signal driving circuitry depending on which driver is activated.

25 Claims, 5 Drawing Sheets

SIGNAL LINE DRIVERS

BACKGROUND

The invention relates to signal line drivers.

On circuit boards, increased switching speeds of signals (some in the sub-nanosecond range) transmitted between components have raised various issues, including increased noise, signal reflections, and power consumption by the components. A source of power dissipation by circuit board components (e.g., integrated circuit chips such as processors, microcontrollers, memory devices, gate array chips, application-specific integrated circuit chips, and the like) is from driver circuitry used to drive signal lines between the components.

One common signaling scheme includes GTL (Gunning transceiver logic) circuitry, which are open-drain drivers having external pull-up resistors. GTL driver circuitry reduces power dissipation for chip-to-chip communication by using an output signal swing that is smaller than the signal range of the driver circuitry in the chips. A further benefit of the reduced voltage swing of signals driven by GTL driver circuitry is increased transmission speeds of signals.

A bi-directional GTL signaling scheme is illustrated in FIG. 5, which includes a signal line 10 coupled to driver circuitry 12 and 14 located in chips coupled to different points on the signal line 10. The driver circuitry 12 includes a pull-down N-channel metal oxide silicon (NMOS) transistor 16 and an external pull-up resistor 18 coupled between a termination voltage Vtt and the drain of the transistor 16. The driver circuitry 14 on the other end similarly includes an NMOS pull-down transistor 20 and an external pull-up resistor 22. Conventionally, the termination voltage Vtt may be set lower than the available supply voltage of the chip to reduce the amount of output signal voltage swing.

However, as supply voltages to components continue to decrease, a limit is placed on how much lower the termination voltage Vtt can be set. The combination of reduced signal voltage swings and higher signal switching speeds may cause reduced noise margins on signal lines. As a result, increased power savings become difficult.

Another type of signaling circuitry includes source terminated complementary metal oxide silicon (CMOS) circuitry, in which drivers include both P-channel metal oxide silicon field effect transistors (MOSFETs) and N-channel MOSFETs that drive a signal line. Source termination resistors, placed in series with the signal line, are sized so that the driver output impedance plus the resistance of the resistor matches the signal line impedance. With this topology, the driving waveform is cut in half by the source termination resistor before being sent down the signal line to a high impedance receiver that positively reflects the incident wave to provide a full signal swing. Typically, source terminated CMOS circuitry has lower power consumption over GTL circuitry. However, with source terminated CMOS circuitry, the signal line is left floating when the coupled drivers are inactive, which may result in power loss due to leakage current through partially on transistors. The floating signal line is also unpredictable, as it may float to any voltage when undriven and may even move with noise. Because of unpredictable signal line behavior when a signal line is left floating by source-terminated CMOS circuitry, backwards compatibility with GTL signal drivers is not available, indicating the desirability of a protocol change.

Thus, signal driving circuitry is needed that reduces power consumption while reliably maintaining signal integrity.

SUMMARY

In general, according to an embodiment, circuitry includes first and second drivers that are coupled to a transmission line. The first driver includes a transistor to drive the transmission line to a specified voltage when the first and second drivers are inactive.

Other features will become apparent from the following description and from the claims.

DETAILED DESCRIPTION

Figure 1:
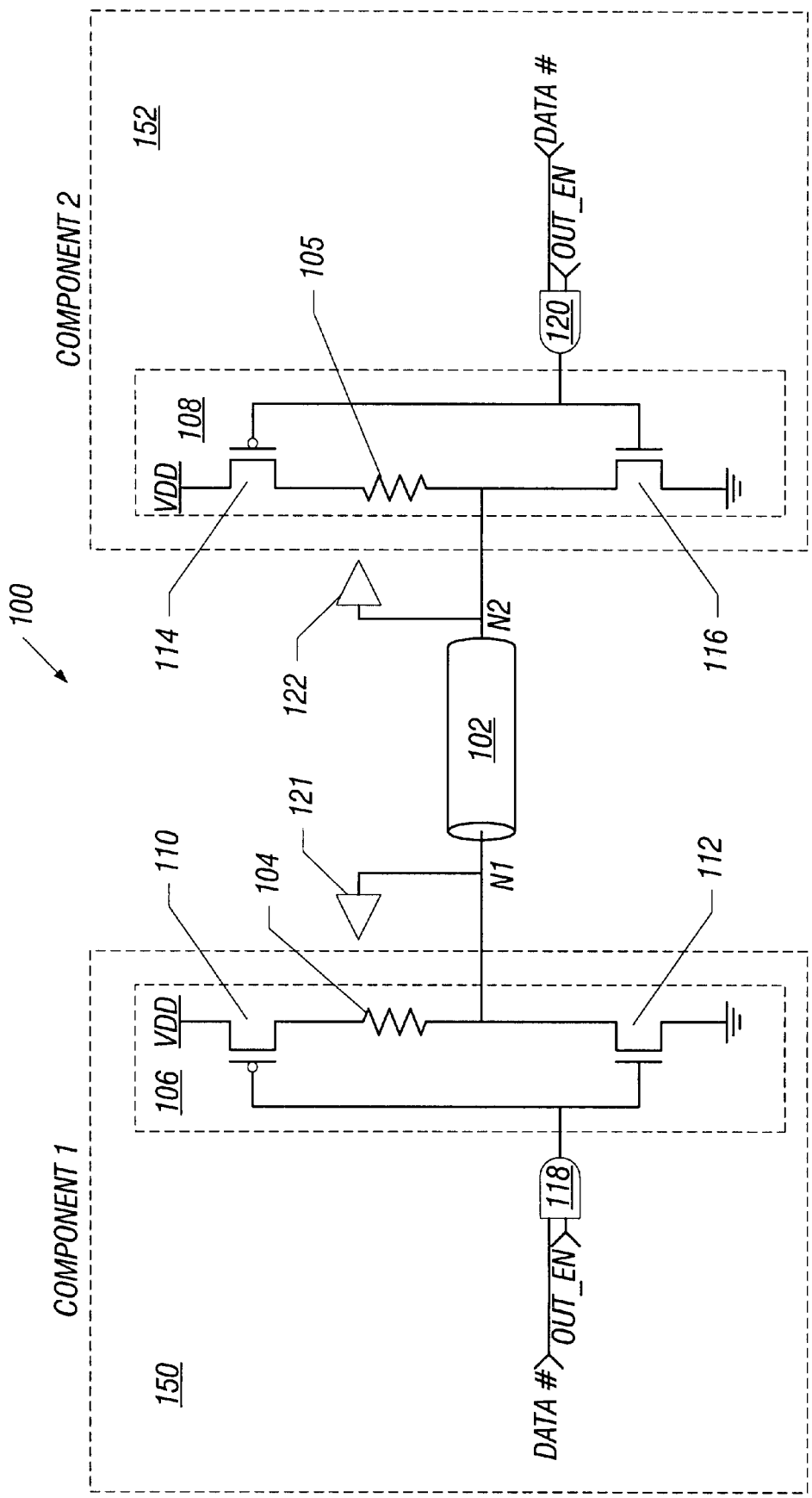
FIG. 1 is a diagram of a signal driver circuit according to an embodiment of the invention.

Referring to FIG. 1, according to an embodiment, a complementary metal oxide silicon (CMOS) signal driver circuit 100 is illustrated. In the illustrated embodiment, a signal line or transmission line 102 (which may be part of a bus, for example) is coupled between drivers 150 and 152, which may be located in separate chips coupled to different points on the signal line 102, although the invention is not limited in scope to separate chips. The drivers 150 and 152 include termination inverters 106 and 108, respectively, which have resistors 104 and 105 that are sized to match the impedance of the signal line 102. The CMOS inverters 106 and 108 are coupled between a power supply voltage VDD and a ground voltage. A signal on the signal line 102 is received by receivers 121 and 122 located in the chips coupled to points on the signal line 102.

The inverter 106 includes an N-channel MOS (NMOS) transistor 112 and a P-channel MOS (PMOS) transistor 110 coupled in series with the resistor 104. The inverter 108 similarly includes an NMOS transistor 116 and a PMOS transistor 114 connected in series with the resistor 105.

In the circuit diagram of FIG. 1, discrete resistors 104 and 105 are illustrated. However, the resistors 104 and 105 may be substituted with PMOS transistors 110 and 114, respectively, that are sized to provide resistance that match the signal line impedance when the PMOS transistors are switching. For example, if the impedance $Z_0$ of the signal line 102 is 65Ω, then the PMOS transistor 110 or 114 is sized to provide a matching impedance of 65Ω when it is switching. On the other hand, each NMOS transistor 112 or 116 may be sized to provide a relatively small resistance during switching. By way of example, for a PMOS transistor having a linear impedance of 65Ω, the NMOS transistor may be selected to have an impedance of less than about 8Ω during switching.

Using the topology illustrated in FIG. 1, the matching resistance of the PMOS transistors 110 and 114 (or alternatively, the combination of the PMOS transistor and resistor impedances), to the signal line, provides substantially perfect far-end termination such that no signal reflection (or very small reflection) may be achieved.

The gates of the PMOS and NMOS transistors 110 and 112 in the inverter 106 are driven by an AND gate 118 that receives an inverted data input (DATA#) and an output enable input (OUT_EN) in a first component. The PMOS and NMOS transistors 114 and 116 are driven by an AND gate 120 that receives an inverted data input and an output enable input in a second component.

In the illustrated configuration, the PMOS transistor 110 or 114 of an inactive driver (either 150 or 152, or both) is active, which couples VDD to the inverter output node N1 or N2. As a result, if both drivers 150 and 152 are inactive, the signal line 102 is pulled high. If, however, one driver is active but the other inactive, the matching resistance (provided by the PMOS transistor or the combination of the PMOS transistor and resistor) in the inactive driver provides substantially perfect far-end termination for the active driver. Thus, one aspect of the embodiment of FIG. 1 is that termination devices (including the PMOS transistors 110 and 114) may be switched in and out (alternately activated and deactivated) of the driver circuit 100 as needed. This is distinguished from conventional GTL signaling schemes in which the termination resistors provide electrical paths between the signal line and VDD regardless of which drivers are active or inactive.

Good signal integrity is provided by the matched far-end termination of the driver circuitry of FIG. 1. In addition, because when driving low, an NMOS transistor is pulling current through only one PMOS transistor, less power is consumed as compared to that of the GTL signaling circuitry. Power savings may be achieved using the signaling circuitry of FIG. 1 over some GTL signaling circuitry; in some cases, the power dissipated using GTL circuitry may be almost twice that of the far-end terminated CMOS circuitry of FIG. 1.

Further, because undriven signal lines are held high, the far-end terminated CMOS signal driving circuitry according to some embodiments of the invention may replace existing GTL signaling designs without a protocol change. Thus, in a system where the supply voltage VDD is already at a relatively low level, the CMOS signal driving circuitry according to this embodiment of the invention is advantageous in decreasing power consumption without sacrificing signal integrity and noise immunity.

Further, the CMOS signal driving circuitry described for this embodiment allows more than two points to be coupled to the signal line 102, thus allowing more than two components to be coupled to the line while still providing substantially perfect far-end termination for the line.

Figure 3:
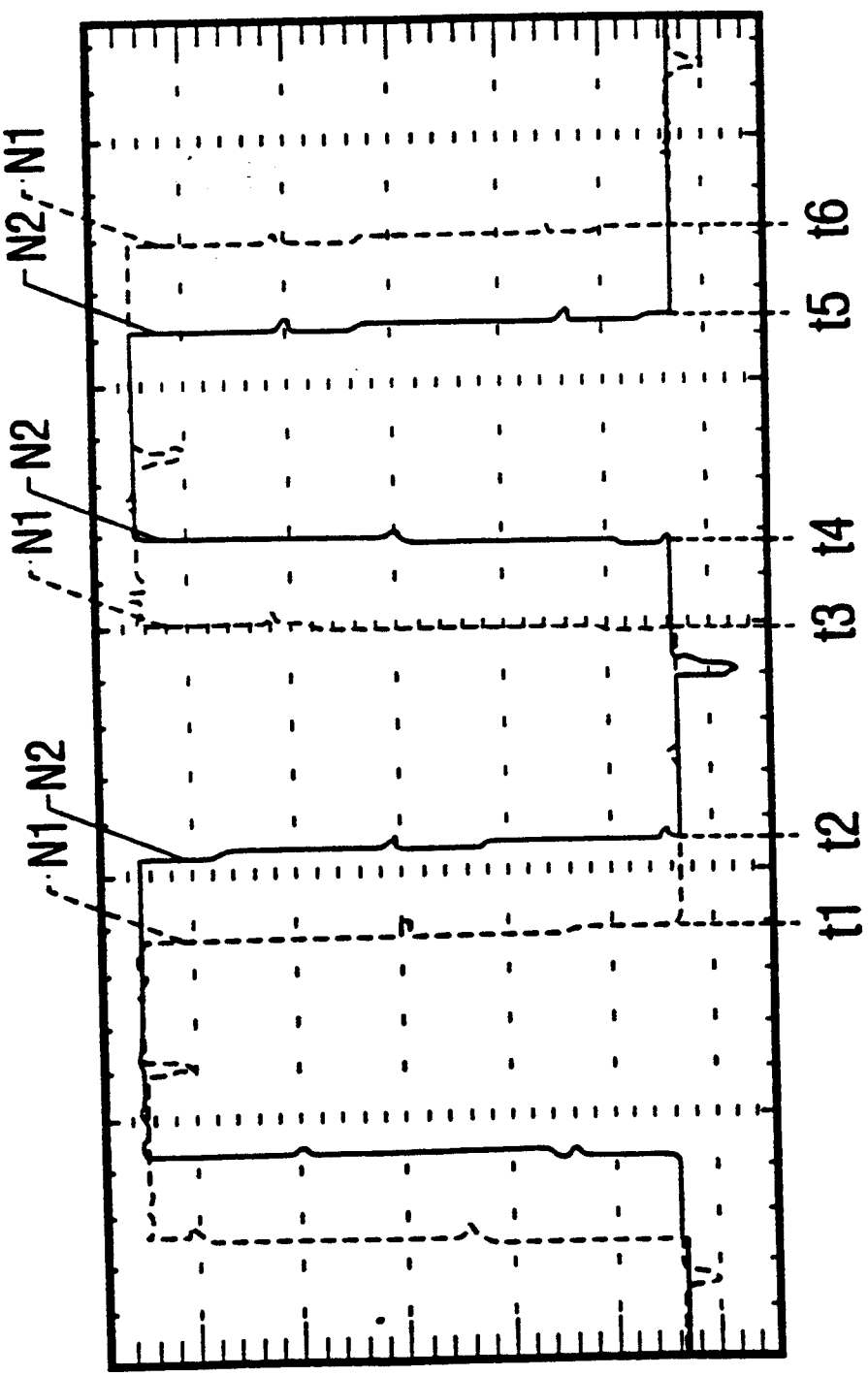
FIGS. 3 and 4 are timing diagrams illustrating signals driven by the circuitry of FIGS. 1 and 2, respectively.

Referring further to FIG. 3, a timing diagram is illustrated of source and received signals driven by one of drivers 150 and 152 and received by one of receivers 122 and 121, respectively. The signals at output nodes N1 and N2 are illustrated. At time t1 the NMOS transistor 112 in the driver 150 drives N1 low. Some delay later, as determined by the propagation delay of the transmission line 102, a received signal at N2 is driven low at time t2. With substantially perfect far-end termination, little or no reflection of the originating signal is observed. At time t3, the active driver 150 is deactivated while the driver 152 remains inactive, which causes the signal at N1 to be pulled high by the PMOS transistor 110. Some delay later, the received signal at N2 is pulled high by PMOS transistor 114 at time t4. Thus, when the drivers on the signal line 102 are all inactive, the line 102 is pulled high. At time t5, the signal line 102 is driven from the other end by the driver 152, with the signal at N2 driven low. The received signal at N1 goes low at time t6.

Figure 2:
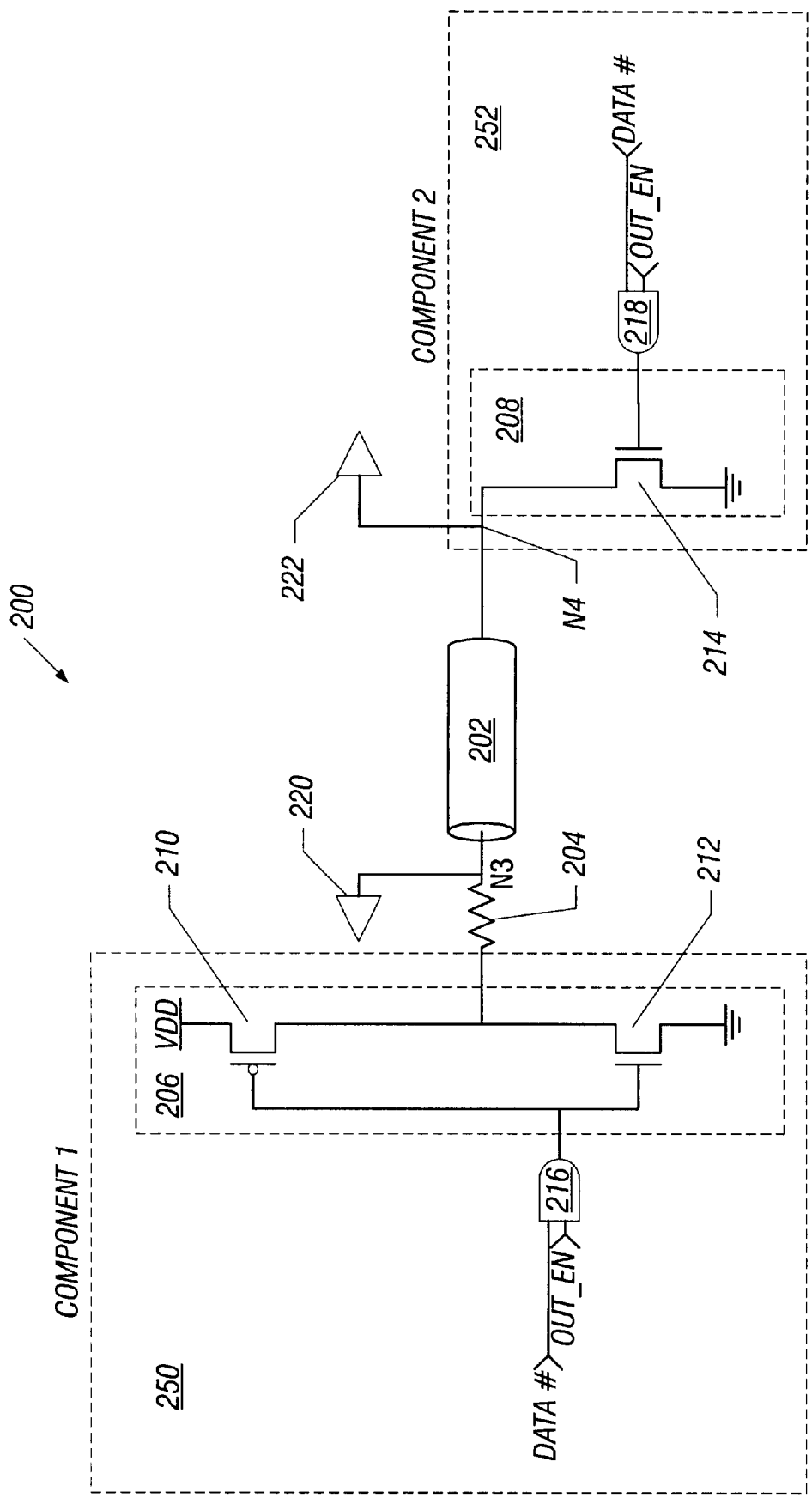
FIG. 2 is a diagram of signal driver circuit according to another embodiment of the invention.

Referring to FIG. 2, according to another embodiment, a hybrid signal driving circuitry 200 is illustrated that is a combination of the source-terminated CMOS signaling scheme and the low power far-end termination signaling scheme described in connection with FIG. 1. The driver circuit topology illustrated in FIG. 2 is advantageous for low-power, high-speed point-to-point bus systems in which components coupled to a bus run off different power supply levels.

The signaling circuitry 200 includes a first driver circuit 250 (that is a modified source-terminated CMOS driver) and a second driver circuit 252 (that is a GTL-type driver) that both are capable of driving a signal line 202. The driver circuit 250 includes a CMOS inverter 206 (having a PMOS transistor 210 and an NMOS transistor 212 connected between VDD and ground voltages) that drives the signal line 202 through a resistor 204 coupled in series with the signal line 202. The combination of the output impedance of the inverter 206 and the resistance of the resistor 204 matches the impedance of the line 202. In the illustrated embodiment of FIG. 2, the gates of the PMOS and NMOS transistors 210 and 212 are controlled by an AND gate 216, which receives an inverted data input (DATA#) and an output enable input (OUT_EN) in a first component.

In an alternative embodiment, the resistor 204 may be replaced by using PMOS and NMOS transistors in the inverter 206 that have higher Vgs (transistor gate-to-source voltage) and Vds (transistor drain-to-source voltage) characteristics to keep the transistors in the linear region and behaving as resistors.

The other side of the signal line 202 is driven by a driver 208 that includes a pull-down NMOS transistor 214. The gate of the transistor 214 is controlled by an AND gate 218 that receives an inverted data input and an output enable input in a second component.

When the signal line 202 is undriven, it does not float but is pulled high by the PMOS transistor 210. Some advantages of the circuitry of FIG. 2 are that it is simple to implement, provides good signal integrity, and dissipates relatively low power as compared to GTL circuitry. With the ability to switch termination devices in and out of the driver circuit 200 (in this embodiment the PMOS transistor 210), different termination techniques may be mixed as in the embodiment of FIG. 2 in which a source-terminated driver may be alternately enabled with a GTL-type driver.

Figure 4:
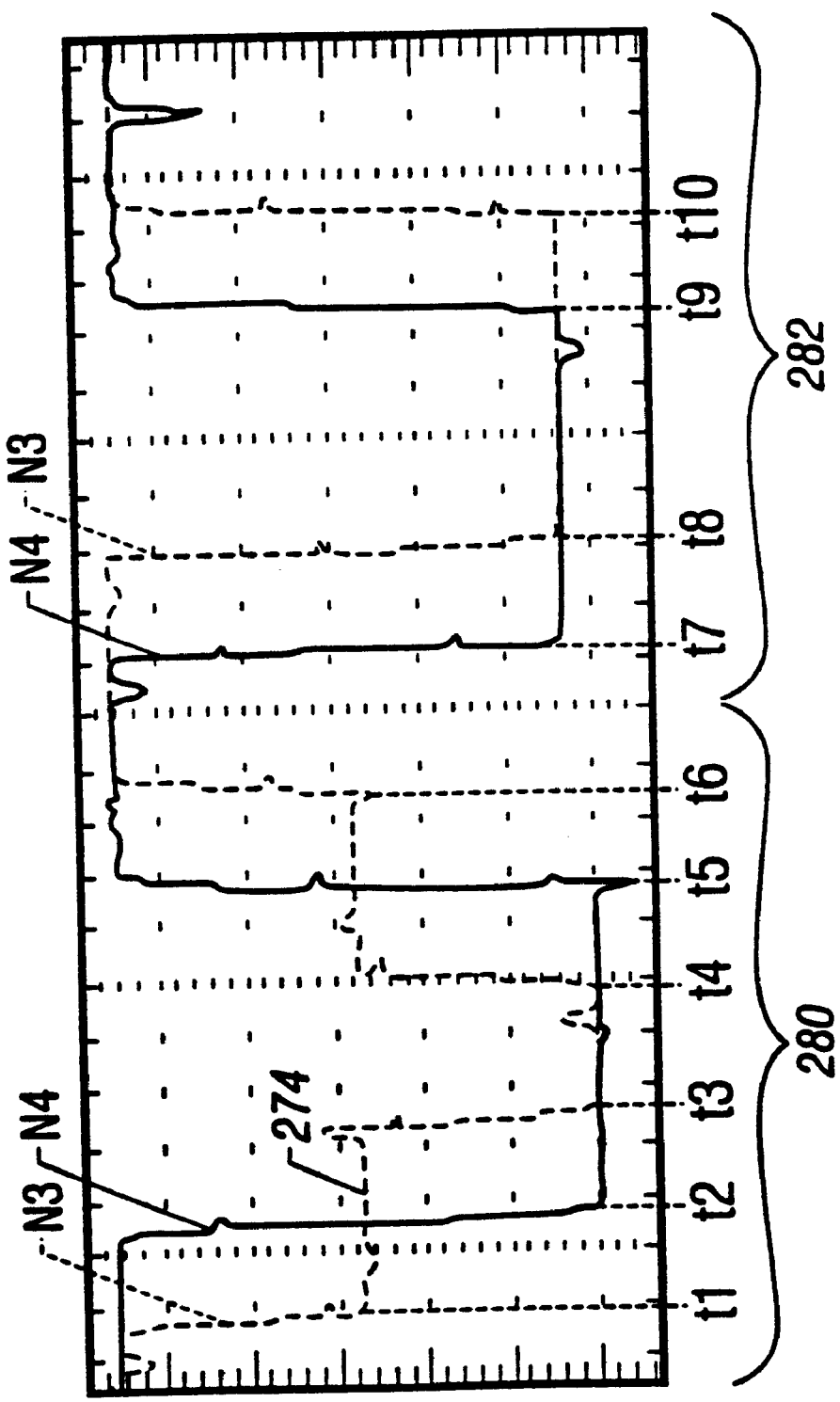
Figure 5:
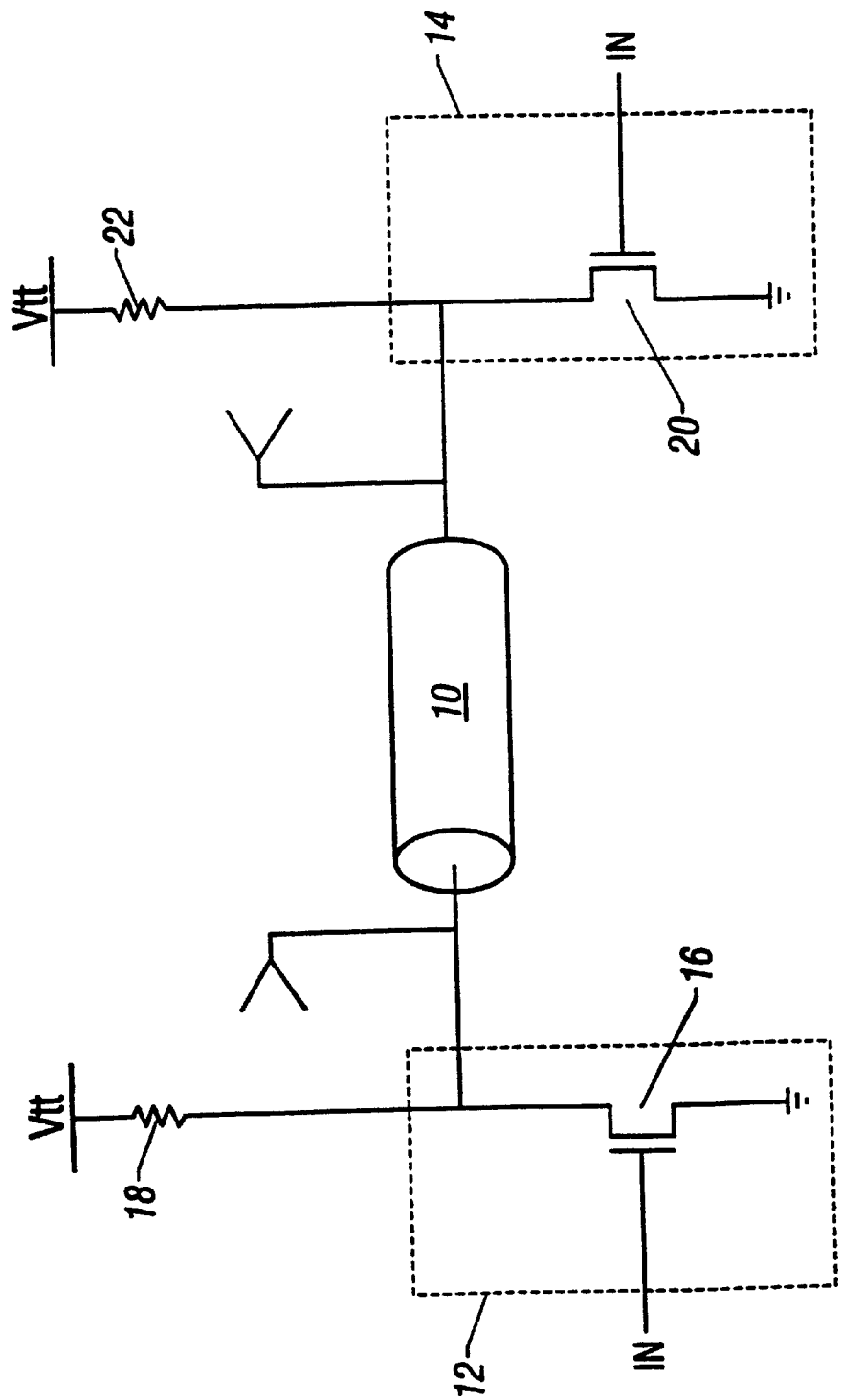
FIG. 5 is a diagram of a prior art signal driver circuit.

Referring further to FIG. 4, the timing diagram of signals at nodes N3 and N4 on the signal line 202 driven by the hybrid circuitry of FIG. 2 is illustrated. Time period 280 represents a time period when the driver 250 is active and time period 282 represents a time period when the driver 252 is active. At time t1, the signal at N3 is driven by the driver 250 to half the supply voltage VDD level due to the voltage divider effect of the resistor 204 and the resistance of the signal line 202. The half-VDD signal is driven down the signal line 202. A shelf 274 at the half-VDD voltage level at node N3 is provided for a time period between t1 and t3. The delay between t1 and t3 is the time for the half-VDD signal to transition down signal line 202 and to be reflected back by the open drain of the driver 252. At time t2, the signal at the receiving node (N4) is driven low. The signal at N4 is the combination of the half-VDD signal driven by the source side (N3) down the signal line 202 and the half-VDD reflected from the open drain of the NMOS transistor 214. When the reflected portion makes its way across the transmission line 202 back to node N3, the signal at node N3 is pulled low to ground at time t3.

At time t4, the driver 250 is deactivated while the driver 252 is maintained inactive, and the PMOS transistor 210 pulls node N3 up to half VDD. At time t5, the driven signal in combination with the reflected signal from the open drain of the driver 208 causes the signal at N4 to be driven high to VDD. At time t6, the signal at N3 is driven high to VDD when the half-VDD signal is reflected back over the line 202. Between times t6 and t7, both drivers 250 and 252 are off, allowing the PMOS transistor 210 to maintain the signal line 202 high. As illustrated, the signal driven by the driver 250 exhibits source terminated signaling characteristics due to the reflection from the open drain of the inactive driver 252.

At time t7, the signal driver 252 is activated to drive the signal (at node N4) low. A time delay later, at t8, the signal is driven low at node N3. Because the PMOS transistor 210 and the resistor 204 provide substantially perfect far-end termination, little or no reflection occurs. When the driver 252 is deactivated, the signals at nodes N4 and N3 are pulled high at times t9 and t10, respectively. Thus, as seen in FIG. 4, the signals seen at the receiving end (receiver 220 or 222) of the driver 250 or 252 have good square wave characteristics. In some cases, the power savings provided by the hybrid signal driving circuit 200 is superior to that of the far-end terminated CMOS driving circuit 100 illustrated in FIG. 1.

The two signal driving circuits according to embodiments of the invention provide low power solutions for component-to-component signaling. With respect to power, both are superior to dual- and single-terminated GTL signal driving circuits for components that are running at voltages that are too low to take advantage of the smaller signals that GTL offers. Each of the described embodiments offers comparable signal integrity, speed, and ease of implementation to that of GTL. Further, the two schemes have an advantage over source terminated CMOS signal driving circuitry for systems in which a bus is pulled high when inactive.

Other embodiments are within the scope of the following claims. For example, the signal line may be coupled to any number of components provided speed and load requirements are not violated. Although the signaling scheme shows the signals activated low and deactivated high, the opposite may be true.

While the invention has been disclosed with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A system comprising:
   a transmission line having an impedance;
   first and second signal drivers coupled to different points on the transmission line,
   the first driver including a transistor and a resistance that matches the transmission line impedance,
   the transistor being active to drive the transmission line to a specified voltage when the first and second drivers are both inactive,
   the second driver having a predetermined state when the second driver is inactive, the second driver remaining in the predetermined state when the first driver drives the transmission line from a first state to a second state and when the first driver drives the transmission line from the second state to the first state.

2. The system of claim 1, wherein the transistor is deactivated when the first driver is actively driving the transmission line.

3. The system of claim 1, wherein the first driver further includes a second transistor that drives the transmission line to a second voltage when the first driver is active.

4. The system of claim 1, including a resistor coupled between an output node of the first driver and a node of the first transistor.

5. The system of claim 1, wherein the first driver includes a P-channel metal oxide silicon transistor and an N-channel metal oxide silicon transistor.

6. The system of claim 5, wherein the resistance is provided by the PMOS transistor.

7. The system of claim 6, wherein the N-channel metal oxide silicon transistor has an impedance substantially less than the P-channel metal oxide silicon transistor during switching.

8. The system of claim 5, wherein the P-channel metal oxide silicon and N-channel metal oxide silicon transistors are arranged in a complementary configuration.

9. The system of claim 1, wherein the second driver includes a P-channel metal oxide silicon transistor and an N-channel metal oxide silicon transistor.

10. The system of claim 9, wherein the P-channel metal oxide silicon and N-channel metal oxide silicon transistors are arranged in a complementary configuration.

11. The system of claim 1, wherein each of the first and second drivers includes a complementary metal oxide silicon inverter capable of driving the transmission line.

12. The system of claim 1, wherein the first and second signal drivers each includes a termination device that is alternately activated and deactivated.

13. The system of claim 12, wherein the termination device in the first signal line driver includes the resistance.

14. The system of claim 1, wherein the second driver comprises a first transistor and a second transistor, the predetermined state of the second driver corresponding to the first transistor being on and the second transistor being off in the second driver.

15. Circuitry for driving a transmission line having an impedance, the circuitry comprising:
    a resistance to match the transmission line impedance; and
    first and second drivers coupled to the transmission line,
    the first driver including a transistor coupled through the resistance to the transmission line, the transistor driving the transmission line to a known state when both the first and second drivers are inactive,
    the second driver including a transistor coupled to the transmission line without being coupled through a matching resistance.

16. The circuitry of claim 15, wherein the first driver includes a complementary metal oxide silicon inverter capable of driving the transmission line.

17. The circuitry of claim 16, including a resistor coupled between the output of the inverter and a node of the transistor.

18. The circuitry of claim 16, including a resistor coupled between the output of the inverter and the transmission line.

19. The circuitry of claim 16, wherein the second driver includes a complementary metal oxide silicon inverter capable of driving the transmission line.

20. The circuitry of claim 16, wherein the second driver includes Gunning transceiver logic-type signal driver.

21. The circuitry of claim 16, wherein each of the first and second drivers includes complementary metal oxide silicon inverters capable of driving the transmission line.

22. The circuitry of claim 15, wherein the resistance is provided by the first driver output.

23. A method of communicating over a signal line coupling at least two components having respective first and second type drivers, comprising:

the first type driver when enabled driving the signal line through a first matching resistor;

the second type driver when enabled having a transistor driving the signal line directly without driving through a matching resistance; and the first matching resistor providing substantially perfect far-end termination for the second type driver.

24. The method of claim 23, wherein the first type driver includes a transistor, the method further comprising pulling the signal line to a specified voltage level using the transistor in the first type driver when both the first and second type drivers are inactive.

25. The method of claim 23, comprising driving the signal line with the first type driver including a complementary metal oxide silicon inverter and a second type driver including a Gunning transceiver logic-type driver.

* * * * *